United States Patent
Matsumoto et al.

(10) Patent No.: US 6,291,851 B1
(45) Date of Patent: *Sep. 18, 2001

(54) SEMICONDUCTOR DEVICE HAVING OXIDE LAYERS FORMED WITH DIFFERENT THICKNESSES

(75) Inventors: Yuji Matsumoto; Koji Hashimoto, both of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/683,954

(22) Filed: Jul. 19, 1996

(30) Foreign Application Priority Data

| Jul. 21, 1995 | (JP) | 7-185325 |
| Jul. 21, 1995 | (JP) | 7-185326 |
| Nov. 21, 1995 | (JP) | 7-302504 |

(51) Int. Cl.$^7$ .......................... H01L 29/76; H01L 29/00; H01L 29/788

(52) U.S. Cl. ................................. 257/314; 257/500
(58) Field of Search .................. 257/314, 315, 257/500

(56) References Cited

U.S. PATENT DOCUMENTS

| 5,218,568 | * | 6/1993 | Lin et al. | 365/185 |
| 5,293,331 | * | 3/1994 | Hart et al. | 257/315 |
| 5,394,002 | * | 2/1995 | Peterson | 257/321 |
| 5,475,251 | * | 12/1995 | Kuo et al. | 257/316 |
| 5,585,656 | * | 12/1996 | Hsue et al. | 257/321 |
| 5,597,750 | * | 1/1997 | Pio et al. | 438/258 |
| 5,844,269 | * | 12/1998 | Kuo | 257/315 |

FOREIGN PATENT DOCUMENTS 7-130725   5/1995 (JP).

OTHER PUBLICATIONS

Gill et al., "A Novel Sublithographic Tunnel Diode Based 5V–Only Flash Memory", IEDM–90, pp. 119–122, Jan. 1990.*

* cited by examiner

*Primary Examiner*—Olik Chaudhuri
*Assistant Examiner*—Howard Weiss
(74) *Attorney, Agent, or Firm*—Arent Fox Kintner Plotkin & Kahn, PLLC (57) ABSTRACT

Field oxide layers are provided for a semiconductor device in two different thickness, i.e., a first thickness for lower-voltage electronic elements and a second thickness for higher-voltage electronic elements. The second thickness is thicker than the first thickness. An impurity is introduced into the substrate via openings for the first and second field oxide layers. After growth of oxide through the openings, oxidation is continued through the sole opening for the second thickness, thereby providing different thickness of field oxide layers while giving uniform channel stop layers thereunder. By the utilization of growth of a first thickness oxide layers, a gate oxide film of a memory transistor such as an EEPROM can be formed between the first thickness oxide layers. The memory transistor has a reduced size of a thin gate oxide film while securing positive electrical isolation by the second thickness field oxide layers against high voltages during writing and erasing.

3 Claims, 5 Drawing Sheets

SEMICONDUCTOR DEVICE HAVING OXIDE LAYERS FORMED WITH DIFFERENT THICKNESSES

BACKGROUND OF THE INVENTION

This invention relates to a semiconductor device which has oxide layers for electrically isolating electronic elements having a floating gate, e.g., an EEPROM, formed on a semiconductor substrate, and a method of manufacturing the same.

MOS integrated circuits have field oxide layers to electrically isolating electronic elements provided in one region from those in other regions of a semiconductor substrate. It is well known that the field oxide layer is formed by a LOCOS technique.

To form a field oxide layer by the LOCOS technique, a silicon substrate is first exposed to a high temperature ambient of approximately 950° C. to form an $SiO_2$ pad oxide film over the surface thereof. Subsequently, a nitride film of $Si_3N_4$ is deposited by the CVD method over the pad oxide film, followed by formation of a photoresist layer over the nitride film. The photoresist layer is then treated by a photolithography technique to pattern the nitride film. Thereafter, the oxide film is selectively oxidized at a temperature of approximately 1000° C. to grow into a field oxide layer with a thickness of approximately 10000 angstroms. In the selective oxidation of the oxide film, the patterned nitride film is utilized as a mask for covering a region where electronic elements are to be formed.

After formation of the field oxide layer together with other electronic elements, a protective insulation layer is formed by the CVD method to a thickness of approximately 10000 angstroms over the entire surface of the substrate. Contact holes are then opened in the insulation layer to allow formation of interconnections of a conductive metal for electrically connecting between electrodes through contact holes, thus providing a semiconductor device.

During the LOCOS process, oxidation proceeds in unmasked portion of the pad oxide film in a direction of thickness thereof, but also toward a direction parallel to the surface of the substrate. To this end, there necessarily occurs bird's beaks, each of which projects from a lateral end of a field oxide layer toward an underside of the nitride film adjacent thereto.

In the conventional electrical isolation with field oxide layers, as an oxide film oxidizes to grow, bird's beaks grow toward an adjacent area where electronic elements are to be formed, thereby reducing the area of active regions. This prevents increase of packing density as well as miniaturization for a device.

Figure 5:
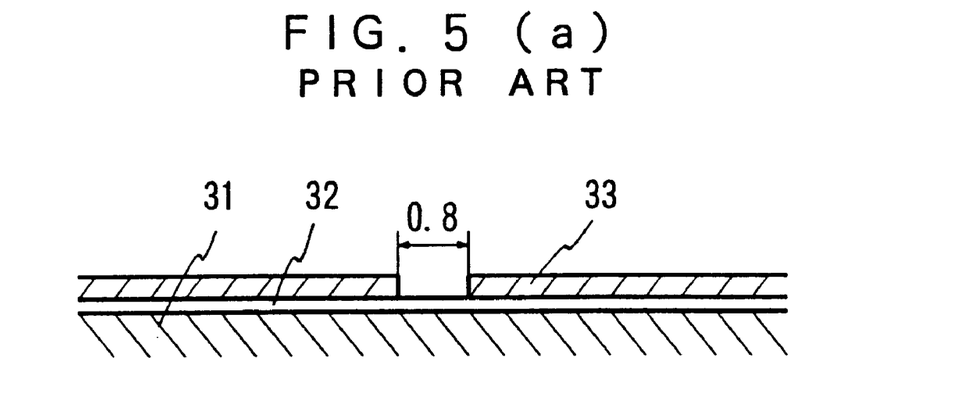
FIG. 5 is a sectional view showing growth of an oxide layer by a LOCOS technique.

More specifically, let us consider the effect of bird's beaks on active regions of a semiconductor substrate. Now, as shown in FIG. 5(a), a pad oxide film 32 is formed to a thickness of, e.g., 500 angstroms over the surface of a substrate 31. A nitride film 33 is deposited to a thickness of 1500 angstroms over the pad oxide film 32 and patterned by the photolithography technique so that the diameter of an opening in the nitride film is 0.8 μm. The pad oxide film 32 is selectively grown by the LOCOS technique to a field oxide layer with a thickness of approximately 10000 angstrom under the ordinary condition. In this case, bird's beaks will occur in lateral ends of field oxides, which extend laterally by an amount of approximately 0.8 μm on both ends of the opening as viewed in the figure. Consequently, the field oxide layer 35, if the bird's beak considered, has a width of as large as approximately 2.4 μm with respect to a direction parallel to the surface of the substrate, as shown in FIG. 5(b).

In order to avoid the effect of the bird's beaks on the active region, if the growth of the oxide layer is suppressed to a thickness of 5000 angstroms by control of oxidation time period, then the amount of the bird's beak becomes approximately 0.4 μm on each side of the opening. Thus, the growth in width of an entire field oxide layer 35' can be reduced as small as approximately 1.6 μm, as shown in FIG. 5(c). It is therefore preferred to reduce small the thickness of a field oxide layer, in view of the effect of bird's beaks.

In the meanwhile, semiconductor device with high packing density generally employs electronic elements operable on a high voltage, e.g. 12V, necessitating a thickness for field oxide layers of approximately 10000 angstroms for appropriately providing electrical isolation. It is therefore difficult to sufficiently reduce the entire size of a semiconductor device.

Under the above-stated circumstances, Japanese Provisional Patent Publication (Kokai) No. H7-130725discloses a method to prevent the effect of bird's beaks by adjusting the thickness of field oxide layer in accordance with voltages for driving electronic elements provided in active regions isolated by the field oxide layers. In the disclosure, an active region in which low-voltage electronic elements with a thin gate oxide film are provided is isolated by a thin field oxide layer. On the other hand, an active region in which high-voltage electronic elements with a thick gate oxide film are provided is isolated by a thick field oxide layer, thereby preventing the problem of electrical isolation as well as reducing the size of an entire device.

In the method of the Japanese provisional patent publication, however, an electronic element with a floating gate necessitates a thin gate oxide film between the floating gate and the substrate, which is necessarily placed in an active region isolated by a thin field oxide layer.

In the meanwhile, an electronic element such as an EEPROM having a floating gate operates on a high voltage, e.g., 12V during writing or erasing of information. Consequently, it is difficult to appropriately provide electrical isolation with the thin field oxide layer. Furtheremore, the method of the above Japanese provisional patent publication does not include means for forming channel stop layers underneath field oxide layers. In particular, it is difficult to provide channel stop layers uniformly beneath both the thinner and thicker field oxide layers by the disclosed method. That is, a first opening is formed in a nitride layer in a place where a thicker field oxide layer is to be grown, and then a second opening is formed in the nitride film in another place where a thinner field oxide layer is to be grown, continuing oxidation to provide both the thinner and thicker field oxide layers. Consequently, if an impurity is implanted after the formation of the second opening, the presence of grown oxide layer in the first opening makes difficult uniform formation of a channel stop layer.

SUMMARY OF THE INVENTION

It is an object of the invention to provide a semiconductor device and a manufacturing method thereof, which device has field oxide layers providing appropriate electrical isolation against applied high voltage and facilitating for providing a thin gate oxide film, thereby providing miniaturization as well as high packing density for the device.

It is another object of the invention to provide an EEPROM as a semiconductor device improved in rewritability, and a method of manufacturing the same.

It is further object of the invention to provide a method of manufacturing a semiconductor device having thin and thick field oxide layers, wherein channel stop layers are uniformly formed so that electrical isolation is given to electronic elements even with minimized thickness of field oxide layers.

According to one aspect of the present invention, there is provided a semiconductor device having a semiconductor substrate of a first conductivity type, field oxide layers formed on the surface of the substrate, and an electronic element having a floating gate formed in an active region defined by the field oxide layers of the substrate, wherein the electronic element comprising:

oxide layers formed in a thickness thinner than the field oxide layer to define a channel region in the surface of the substrate;

a gate oxide film formed thinner than the oxide layer over the channel region of the substrate;

a source region of a second conductivity type formed to extend underneath one of the oxide layers to the surface of the substrate on the side opposite to the channel region with respect to the one oxide layer;

a drain region of the second conductivity type formed to extend underneath another of the oxide layers to the surface of the substrate on the side opposite to the channel region with respect to the another oxide layer; and a floating gate formed over the surface of the gate oxide film.

With such structure, the electronic element is formed by utilizing a channel region defined between the oxide layers with the thickness thinner than that of the field oxide layer. In this case, electrical isolation is appropriately provided for the electronic element by the field oxide layers.

In a semiconductor device which has a first field oxide layer with thinner thickness and a second field oxide layer with thicker thickness, the thinner thickness oxide layer is formed in common processes with the first field oxide layer. Accordingly, fabricating the above element having a floating gate are effective particularly for a semiconductor device involving first and second field oxide layers for respective low-voltage electronic elements and high-voltage electronic elements.

Where the electronic element is an EEPROM, the EEPROM may comprise a tunnel oxide film formed in the another oxide layer in a thickness thinner than the gate oxide film, and the floating gate being formed to extend over the tunnel oxide film. With such construction, the capacitance between the floating gate and the drain region as well as between the floating gate and the source region is reduced small. As a result, the coupling ratio for the EEPROM increases, thereby enhancing rewritability.

According to a second aspect of the present invention, there is provided a method of manufacturing a semiconductor device having first field oxide layers and second field oxide layers having a thickness different from the thickness of the first oxide layer, the method comprising the steps of:

(a) forming a first oxidation preventing film over an oxide film formed over the surface of a semiconductor substrate;

(b) forming first and second openings respectively in areas where the first and second field oxide layers are to be formed;

(c) introducing an impurity of a first conductivity type via the first and second openings into the substrate for providing channel stop regions;

(d) growing the oxide film in portions exposed by the first and second openings utilizing the first oxidation preventing film as a mask into oxide layers;

(e) forming a second oxidation preventing film over the surface of the substrate to provide a third opening in an area where a second field oxide layer is to be formed; and (f) growing further the grown oxide layer in portions exposed by the third opening by utilizing the econd oxidation preventing film as a mask into second field oxide layers, thereby defining first field oxide layers.

With such method, an impurity is introduced into the substrate via openings of the oxidation preventing film under the same condition to uniformly provide channel stop regions. Therefore, electrical isolation is available with a minimum thickness of field oxide layers.

According to a third aspect of the present invention, a method of manufacturing a semiconductor device with a floating gate, wherein said semiconductor device has a semiconductor substrate of a first conductivity type, and an electronic element formed in an active region defined by field oxide layers, the method comprising the steps of:

(a') forming a first oxidation preventing film on a pad oxide film over the surface of the substrate;

(b') forming first and second opening in the first oxidation preventing film respectively in areas where oxide layers are to be formed to define a channel region for the electronic element and the field oxide layers are to be formed;

(c') introducing an impurity of a second conductivity type via the first opening for providing source and drain regions, and an impurity of a first conductivity type via the second opening for providing channel stop regions;

(d') growing the pad oxide film in portions exposed by the first and second openings by utilizing the first oxidation preventing film as a mask into oxide layers with a first thickness;

(e') forming a second oxidation prevention film on the surface of the substrate to provide a third opening therein;

(f') forming a field oxide layer in the third opening by utilizing the second oxidation preventing film as a mask to grow part of the oxide layers into field oxide layers;

(g') forming a floating gate over a gate oxide film defined between the oxide layers on the surface of the substrate; and (h') introducing an impurity of the second conductivity type to form source and drain regions respectively on opposite side to the floating gate with respect to the oxide layers.

With such method, the tunnel oxide film is formed in one of the oxide layers close to the drain region to a thickness thinner than the gate oxide film.

Additional objects, advantages, and features of the present invention will become apparent from the following description and appended claims, taken in conjunction with the accompanying drawings.

DETAILED DESCRIPTION OF THE INVENTION

The invention will now be described in detail with reference to the drawings showing embodiment thereof.

Figure 1:
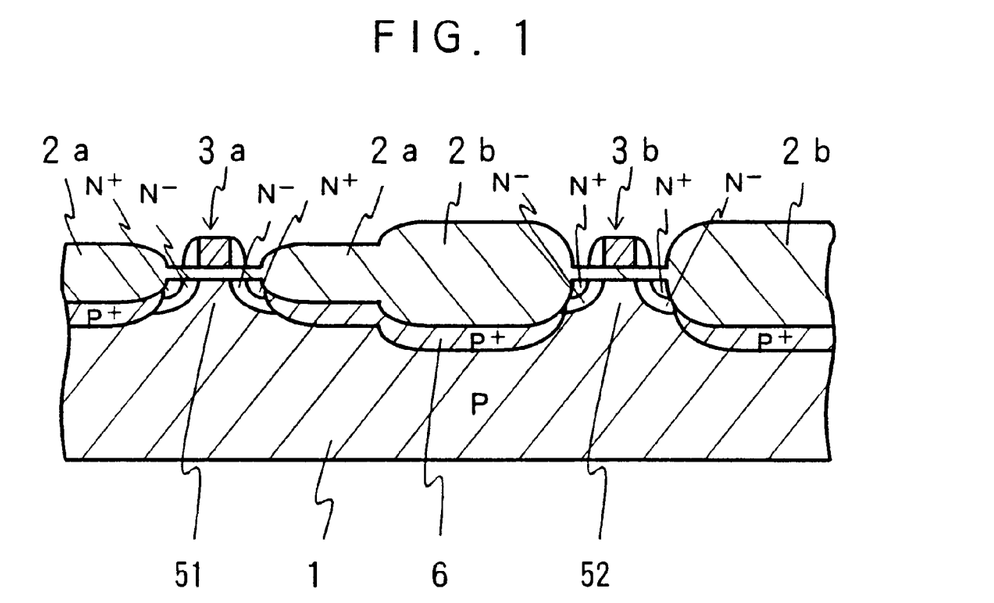
FIG. 1 is a partial sectional view of a semiconductor device according to one embodiment of the invention.

Referring first to FIG. 1, there is illustrated a principal part of a semiconductor device which was manufactured by the method according to the present invention. The semiconductor device comprises a semiconductor substrate 1 formed of silicon of a P type as a first conductivity type. The semiconductor substrate 1 has a surface thereof formed with a first $SiO_2$ field oxide layer 2a and a second $SiO_2$ field oxide layer 2b. A plurality of transistors 3a, 3b as electronic elements are provided which are electrically isolated by the first or second field oxide layers 2a, 2b from electronic elements of other areas. The second field oxide layer 2b has a second thickness which is thicker than the first thickness of the first field oxide layer 2a. A first active region 51 is electrically isolated by the first field oxide layer 2a, whereas a second active region 52 is electrically isolated by the second field oxide layer 2b. The second active region 52 includes an electronic elements 3b which is higher in operating voltage than electronic elements 3a placed in the first active region 51. Channel stop layer 6 is provided by a $P^+$-type impurity region which extends underneath the field oxide layer 2a, 2b. It is noted that the number of electronic elements increases as the scale of the semiconductor device increases, though the example of FIG. 1 shows mere part of the semiconductor device.

The electronic elements 3a placed in the first active region 51 is a field effect transistor (FET) of a lightly-doped drain (LDD) type for a logic circuit which operates on a lower voltage, e.g., 5 volts. The electronic element 3a comprises a gate electrode of polysilicon having side walls on side faces thereof, a source region and a drain region which are doped light beneath the respective side walls. The electronic element 3a is given of electrical isolation by the first field oxide layer 2a with a thinner thickness, e.g., 5000 angstroms. it is also possible to include in the first active region 51 electronic elements, such as resistors or capacitors operable on a substantially equivalent voltage, other than the above-stated element in addition thereto or independently thereof.

On the other hand, the electronic element 3b, placed in the second active region 52 is an FET of a high-voltage type for a voltage-raising circuit, which operates on a higher voltage, e.g., 12 volts. The electronic element 3b comprises a gate electrode of polysilicon having side walls on lateral faces thereof, and double-layered source and drain regions formed under the gate electrode. The electronic element 3b is given of electrical isolation by the second field oxide layer 2b which is as thick as approximately 10000 angstroms. It is also possible to include in the second active region 52 electronic elements, such as resistors or capacitors operable on an equivalent voltage, other than the above-stated elements similarly to the first active region 51.

The semiconductor device manufactured by the method of the invention has lower-voltage electronic elements placed in the first active region 51 and higher-voltage electronic elements in the second active region 52. With such an arrangement, the higher-voltage electronic elements are positively isolated by the second field oxide layer 2b with a thicker, second thickness, which has a channel stop layer 6 extending along the underneath thereof. The lower-voltage electronic elements are placed in high packing density and electrically isolated in the first active region 51 having suppressed bird's beaks. The first field oxide layer 2a has a channel stop layer 6 formed underneath thereof. In the present embodiment, it is possible to add lower-voltage electronic elements to those of higher voltage in the second active region 52, as required.

The method of manufacturing a semiconductor device according to the present invention will then be explained by referring to FIGS. 2(a)–2(d).

Figure 2:
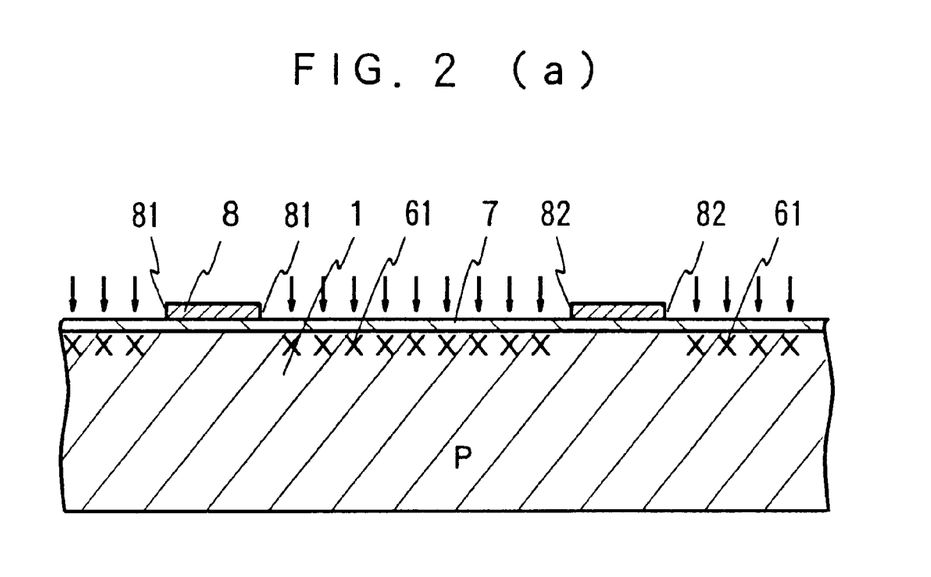
FIGS. 2(a)–2(d) are partial sectional views showing a method of manufacturing the semiconductor device of FIG. 1.

Referring to FIG. 2(a), a semiconductor substrate 1 made of P-type silicon is exposed to a high-temperature ambient to form an $SiO_2$ oxide film (pad oxide film) 7 with a thickness of approximately 500 angstroms over the surface thereof. Then, an $Si_3N_4$ nitride film 8 as a first oxidation preventing film is formed by the CVD method to a thickness of 1500 angstroms over the oxide film 7 in areas where electronic elements are to be formed. The first nitride film 8 is patterned by a usual photolithography method so that first and second openings 81, 82 are formed respectively in places for forming first and second field oxide layers 2a, 2b. Thereafter, a P-type impurity 61 such as boron is introduced into the substrate 1 via the first and second openings 81, 82 for provision of channel stop layers.

Then, the oxide film 7 is selectively grown by using the first nitride film 8 as a mask at a temperature of approximately 1000° C. to a first thickness, e.g., 5000 angstroms, as shown in FIG. 2(b). The first field oxide layers 2a formed by the growth of the oxide film 7 to the first thickness defines the first active region 51 on the surface of the substrate 1, providing also a channel stop layer 6 underneath the grown oxide layers.

After forming the first active region 51, an additional nitride film 9 as a second oxidation preventing film is formed by the CVD method to a thickness of 500 angstroms, as shown in FIG. 2(c). The additional nitride film 9 is then patterned by a photolithography method to form a third opening 93 so that the oxide layer 2a in places for forming second field oxide layer 2b is exposed for growth to a second thickness. In order to obtain a second field oxide layer 2b, it is satisfactory that the oxide layer 2a be unmasked by the first nitride film 8 or otherwise the additional nitride film 9. It is therefore possible to form an additional nitride film 9 after removal of the first nitride film 8. Alternatively, the additional nitride film may be limitedly formed on the first-thickness oxide layer with the first nitride film left as it is.

After forming the third opening 93 in the additional nitride film 9, the first thickness oxide layer 2a is selectively grown to a second thickness, e.g., 10000 angstroms, at a temperature of 1000° C. by using as a mask the additional nitride film 9, together with the first nitride film 8 in the present embodiment, as shown in FIG. 2(d). The growth of the oxide layer 2a to the second field oxide layer 2b defines the second active region 52 on the surface of the substrate.

Incidentally, explanations were omitted on elements such as capacitors, resistors, and well regions. These elements may be provided utilizing the above LOCOS technique.

Then, a method of manufacturing a semiconductor device having a floating gate is explained, wherein the floating gate is employed in a memory transistor for an EEPROM as an electronic element.

Figure 3:
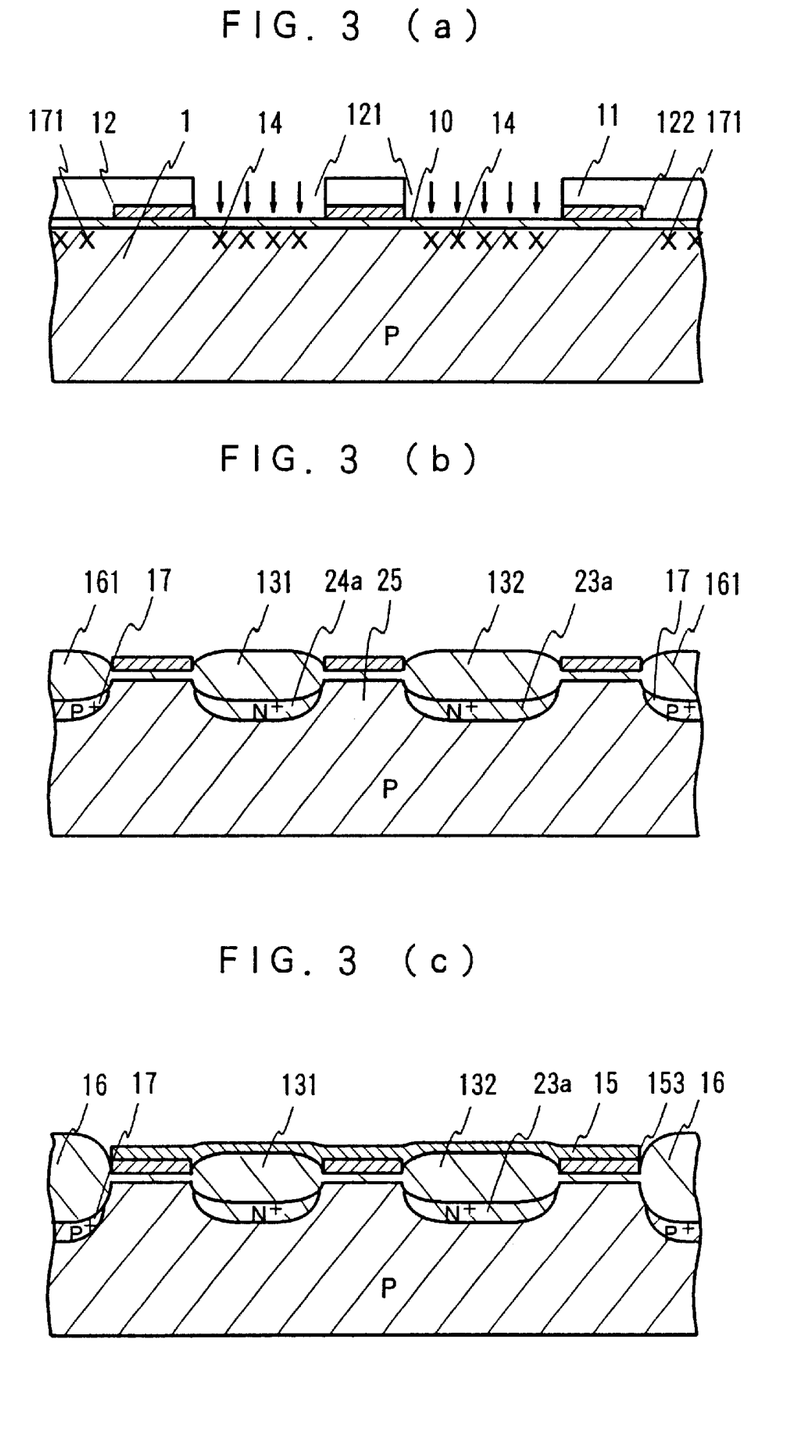
FIGS. 3(a)–3(e) are partial sectional views showing manufacturing an EEPROM to which the method of the invention is applied.

Referring to FIG. 3(a), an $SiO_2$ oxide film (pad oxide film) 10 is first grown to a uniform thickness of approximately 500 angstroms over the surface of a P-type silicon substrate 1, in a manner similar to the above embodiment. Then, an $Si_3N_4$ nitride film 12 as a first oxidation preventing film is formed by the CVD method to a thickness of 1500 angstroms over the oxide film 10, over which a photoresist layer is formed to a given thickness. The photoresist layer is patterned by a photolithography method to etch the first nitride film 12 to provide first and second openings 121, 122. The first opening 121 is formed in such an area that a first-thickness oxide layer is formed to define a channel region for a memory transistor, whereas the second opening 122 is in such a area that a second-thickness oxide layer is formed to isolate electronic elements.

The first opening 121 is then masked by a photoresist layer to introduce a P-type impurity 171 such as boron (B) by ion implanting via the second opening 122 through the oxide film 10 into the substrate 1. After removing the photoresist, a photoresist layer 11 is newly applied and patterned to cover the second opening 122 with the first opening 121 unmasked, as shown in FIG. 3(a).

Then, an N-type impurity 14 such as Arsenic (As) is ion implanted via the first opening 121 through the oxide film 10 into the substrate 1, followed by removing the photoresist layer 11. Then, as shown in FIG. 3(b), the oxide film 10 is selectively grown at a temperature of approximately 1000° C. by the use of the first nitride film 12 as a mask. Oxide layers 131, 132 and 161 thus grown have a first thickness, e.g., approximately 5000angstroms, which are in an active area defined by a field oxidation layer to be formed. By the formation of the oxide layers 131, 132, a channel region 25 is defined therebetween, and N-type buried layers 24a, 23a are formed respectively underneath the oxide layers 131, 132. The respective buried layers 24a, 23a partly constitute a source region and a drain region for a memory transistor. P+-type channel stop layers 17 are also formed underneath the oxide layers 161, 161.

Then, as shown in FIG. 3(c), an additional nitride film 15 as a second oxidation preventing film is formed by the CVD method to a thickness of 500 angstroms over the entire surface of the substrate. A third opening 153 is formed in the additional nitride film 15 in areas that field oxide layers are to be formed. Thereafter, the oxide layer exposed by the third opening 153 is grown to a second thickness of approximately 10000 angstroms at a temperature of 1000° C. , thereby providing second field oxide layers 16, 16 similarly to the above embodiment. The second field oxide layers 16, 16 and the oxide layers 131, 132 defines therebetween areas for providing a drain region and a source region. It is noted that the second field oxide layer 16 in the present embodiment corresponds to the second field oxide layer 2b in the above embodiment, whereas the oxide layers 131, 132 of the present embodiment correspond to the first field oxide layer 2a of the above embodiment.

After removal of the first nitride film 12 and the additional nitride film 15, as shown in FIG. 3(d), a gate oxide film 28 is formed and then a tunnel window 19 is formed by etching in one oxide layer 132. The tunnel window 19 is in a trench form having a thin oxide film 18, e.g., 90 angstroms left in the bottom. A polysilicon film 20 is then patterned to a thickness of approximately 4000 angstroms to extend between the oxide layers 131, 132 including the tunnel window 19 and the gate oxide film 28, simultaneously with formation of a polysilicon film 21. The polysilicon layer 20 constitute a floating gate of a memory transistor for an EEPROM, whereas the polysilicon layer 21 a gate electrode of a select transistor thereof.

After forming the floating gate 20 and the select gate 21, as shown in FIG. 3(e), a control gate 22 is formed of polysilicon over the floating gate 20 and an ONO (oxide-nitride-oxide) film 29. Then, an N-type impurity such as As is introduced into the substrate, using as mask the select gate 21, the control gate 22, the second field oxide layers 16, 16 and oxide layer 131, 132. This introduction of the impurity provides source and drain regions 24, 23 for a memory transistor as well as source and drain regions 26, 27 for a select transistor for a select transistor. In this case, a channel region 25 is provided underneath the gate oxide film 28 in the vicinity of the surface of the substrate.

Thereafter, an insulation layer is formed to cover the electronic elements in the surface of the substrate. Then, contact holes are opened to provide interconnections of aluminum for connecting the control gate 22, the select gate 21, a source region 24, and a drain region 28 of the select transistor, thereby completing the manufacture of the EEPROM.

Figure 4:
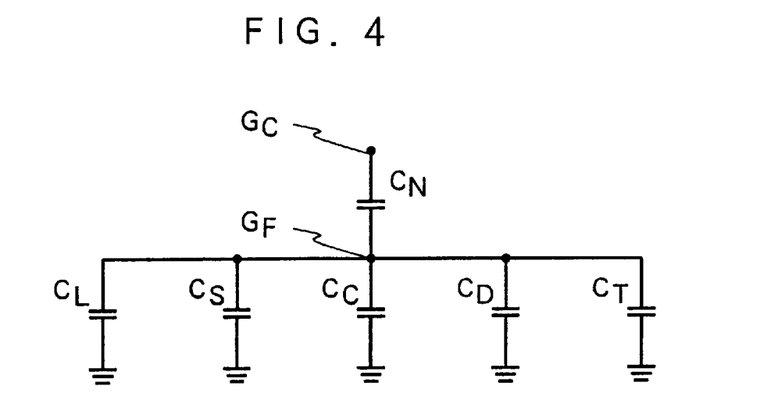
FIG. 4 is a diagram showing capacitance coupling of the EEPROM according to the invention.

FIG. 4 shows capacitance coupling for the manufactured EEPROM. In the figure, $C_N$, $C_L$, $C_S$, $C_C$, $C_D$, and $C_T$ represent capacitance respectively between the floating gate 20 and the control gate 22, the floating gate 20 and the isolating region, the floating gate 20 and the source region 24, the floating gate 20 and the channel region 25, the floating gate 20 and the drain region 23, and the floating gate 20 and the tunnel window 18. $G_C$ and $G_F$ denote respectively the control gate 22 and the floating gate 20. Then, the coupling ratio Cr for the EEPROM, during erasing, is expressed as $C_r=C_N/(C_L+C_S+C_C+C_D+C_T+C_N)$. The method according to the invention is capable of reducing $C_S$ and $C_D$, and thereby increasing $C_r$, provided that the cell area of the EEPROM is constant.

It is therefore possible to improve the rewritability for the EEPROM. In conventional EEPROMs, the oxide layer in an active region is generally formed in thickness of approximately 1000 angstroms. On the contrary, the semiconductor device of the invention has oxide layers partially thickened, e.g., 5000 angstroms, in the active region. Therefore, the semiconductor device of the invention can afford to reduce the values $C_S$ and $C_D$ as small as approximately ⅕ as compared with the conventional device.

Incidentally, in the above embodiments, the first field oxide layer or the first-thickness oxide layer has a thickness of 5000 angstroms, and the second field oxide layer or the second-thickness oxide layer a thickness of 10000 angstroms. The present invention, however, is not limited to such values. These values may be varied in accordance with design or specification of a semiconductor device. Further, an N-type substrate may be used instead of the P-type one.

As explained above, the manufacturing method according to the invention provides a semiconductor device having first field oxide layers with a first thickness and second field oxide layers with a second thickness. The field oxide layers have respective channel stop layers uniformly formed thereunder, providing appropriate electrical isolation.

Also, the semiconductor device with a floating gate according to the invention has a gate oxide film formed between first-thickness oxide layers under the floating gate. The first-thickness oxide layers have a thickness thinner than the field oxide layer. A memory transistor with the floating gate is given of electrical isolation by field oxide layers thicker than the first thickness. Thus, the semiconductor device is constructed small with improved characteristics, while providing sufficient electrical isolation.

Further, the semiconductor device with an EEPROM according to the invention has first-thickness oxide layers formed respectively between a floating gate and a source region as well as the floating gate and the drain region, wherein the first-thickness oxide layers is by far thicker than a gate oxide film. Consequently, the capacitance is reduced small between the floating gate and the source region as well as between the floating gate and the drain region, increasing the coupling ratio. Therefore, the EEPROM has an improved rewritability.

What is claimed is:

1. A semiconductor device comprising:

first field oxide layers having a first thickness formed on the surface of a semiconductor substrate of a first conductivity type;

second field oxide layers having a second thickness which is thicker than said first thickness, formed on the surface of said substrate;

a low voltage electronic element operable on a lower voltage, formed in an active region defined by said first field oxide layers of said substrate; and a high voltage electronic element operable on a higher voltage, formed in an active region defined by said second field oxide layers of said substrate, wherein said high voltage electronic element comprises:

oxide layers formed in a thickness substantially equivalent to the thickness of said first field oxide layers to define a channel region in the surface of said substrate;

a gate oxide film formed thinner than said oxide layer over said channel region of said substrate, a source region of a second conductivity type and having a high impurity concentration, formed underneath one of said oxide layers;

a drain region of the second conductivity type and having a high impurity concentration, formed underneath another of said oxide layers to the surface of said substrate;

a floating gate formed over the surface of said gate oxide film; and a tunnel oxide film formed in said another oxide layer in a thickness thinner than said gate oxide film, said floating gate being formed to extend over said tunnel oxide film.

2. The semiconductor device of claim 1, wherein said tunnel oxide film is formed by a trench in said another oxide layer.

3. The semiconductor device of claim 1, wherein said high voltage electronic element is an EEPROM having a select transistor.

* * * * *